United States Patent [19]

Michl et al.

[11] Patent Number: 4,789,965

[45] Date of Patent: Dec. 6, 1988

[54] METHODS AND COMPOSITIONS FOR RECORDING OPTICAL INFORMATION EMPLOYING MOLECULAR PSEUDOROTATION

[75] Inventors: Josef Michl; Juliusz G. Radziszewski, both of Austin, Tex.

[73] Assignee: The University of Utah, Salt Lake City, Utah

[21] Appl. No.: 926,049

[22] Filed: Oct. 31, 1986

[51] Int. Cl.[4] .................................................. G11C 13/00
[52] U.S. Cl. ...................................... 365/121; 365/107
[58] Field of Search ................ 365/106, 107, 151, 121

[56] References Cited

U.S. PATENT DOCUMENTS

| | | | |
|---|---|---|---|
| 3,119,099 | 1/1964 | Biernat | 365/151 |
| 3,214,382 | 10/1965 | Windsor | 252/301.2 |
| 3,320,067 | 5/1967 | Taylor | 96/90 |
| 3,557,218 | 1/1971 | Hall et al. | 260/592 |
| 3,565,814 | 2/1971 | Pellon | 252/300 |
| 3,687,863 | 8/1972 | Wacher | 252/300 |
| 3,696,263 | 10/1972 | Wacher | 313/108 D |
| 3,868,653 | 2/1975 | Winter | 340/173 LS |
| 4,033,673 | 7/1977 | Seki | 350/160 R |
| 4,346,186 | 8/1982 | Garrett et al. | 524/82 |
| 4,503,177 | 3/1985 | Reid et al. | 524/87 |

FOREIGN PATENT DOCUMENTS

| | | |
|---|---|---|
| 56-21894 | 2/1981 | Japan . |
| 56-25243 | 3/1981 | Japan . |
| 56-27136 | 3/1981 | Japan . |

OTHER PUBLICATIONS

J. Morgan, Introduction to Geometrical and Physical Optics, Chapter 16, McGraw-Hill Book Company, Inc. (1953).
D. von der Linde et al., "Multiphoton Photorefractive Processes for Optical Storage in LiNbO$_3$," 25, Applied Physics Letters, 155-157 (Aug. 1974).
Blume, H. and Bader, T., "Bi-Directional Holographic Information Storage Based on the Optical Reorientation of F$_A$ Centers in KCl:Na," 12, Optics Communications, No. 2, pp. 147-151 (Oct. 1974).
V. N. Seleznev et al., "Materials for Erasable Optical Memories (Review)," 4, Soviet Journal of Quantum Electronics, 819-827 (Jan. 1975).
D. von der Linde et al., "High-Sensitivity Optical Recording in KTN by Two-photon Absorption," 26, Applied Physics Letters, 22-24 (Jan. 1975).
R. L. Kurtz et al., "Holographic Recording Materials—A Review," 14, Optical Engineering, 393-401 (Sep.-Oct. 1975).
R. A. Bartolini et al., "Review and Analysis of Optical Recording Media," 15, Optical Engineering, 99-108 (Mar.-Apr. 1976).
G. R. Levinson et al., "Laser Processing of Thin Films (Review)", 6, Soviet Journal of Quantum Electronics, 885-896 (Aug. 1976).
D. von der Linde et al., "Multiphoton Processes for Optical Storage in Pyroelectrics," 10, Ferroelectrics, 5-8 (1976).

(List continued on next page.)

Primary Examiner—Terrell W. Fears
Attorney, Agent, or Firm—Workman, Nydegger & Jensen

[57] ABSTRACT

Methods and compositions for use in optically recording information. The present invention includes incorporating solute molecules within an extremely viscous medium. The solute molecules may be chemically bound within the medium or they may be held physically in place. In either case actual rotation of the solute molecules is prevented. The solute molecules are chosen such that they are capable of generalized pseudorotation. That is, the solute molecules or chromophores attached to a polymer chain may be converted from a first form to a second form which differs in orientation without a net chemical transformation into another chemical species and in the absence of actual rotation. In addition, the various forms of the solute molecules can be produced by passing selectively polarized light through the medium. The form of the solute molecules can then be "read" by passing light through the medium and detecting its characteristics as it exits the medium.

24 Claims, 1 Drawing Sheet

OTHER PUBLICATIONS

Paper, J. Corcoran et al., "Melting Holes in Metal Films for Real Time, High-Density, Permanent Digital Data Storage," Ampex Corporation, Redwood City, Calif. (Sep. 1977).

G. C. Kenney et al., "An Optical Disk Replaces 25 Mag Tapes," IEEE Spectrum, 33–37 (Feb. 1979).

K. Bulthuis et al., "Ten Billion Bits on a Disk," IEEE Spectrum, 26–33 (Aug. 1979).

J. M. O'Reilly et al., "Scanned Laser Marking of Metallic and Organic Films," 23, Photographic Science and Engineering, 314–318 (Sep.–Oct. 1979).

M. S. Cohen, "Computer Modelling Study of Ablative Optical Recording," 36, Applied Physics Letters, 950–953 (Jun. 1980).

P. Hariharan, "Holographic Recording Materials: Recent Developments," 19, Optical Engineering, 636–641 (Sep./Oct. 1980).

P. Kivits et al., "Superheating of Thin Films for Optical Recording," 24, Applied Physics Letters, 273–278 (1980).

D. G. Howe et al., "Solvent-Coated Organic Materials for High-Density Optical Recording," 18, Journal of Vacuum Science Technology, 92–99 (Jan./Feb. 1981).

D. Y. Lou et al., "Bit Oriented Optical Storage with Thin Tellurium Films," 18, Journal of Vacuum Science Technology, 78–86 (Jan./Feb. 1981).

David Y. Lou, "The Archival Stability of Tellurium Films for Optical Information Storage," 128, Journal of the Electromechanical Society, 699–701 (Mar. 1981).

David Y. Lou et al., "Defect Measurements in Digital Optical Disks," 20, Applied Optics, 887–891 (Mar. 1981).

Article, "Self-Developing Holographic Material Does Not Degrade When Read by Laser," Laser Focus, 22–24 (Mar. 1981).

T. H. Allen et al., "Optical Properties of Tellurium Films Used for Data Recording," 20, Optical Engineering, 373–376 (May/Jun. 1981).

C. D. Eden, "Vanadium Dioxide Storage Material," 20, Optical Engineering, 377–378 (May/Jun. 1981).

D. Strand, "Optical Recording with Amorphous Materials," 20, Optical Engineering, 379–381 (May/Jun. 1981).

H. Brody, "Materials for Optical Storage: A State-of-the-Art Survey," Laser Focus, 47–52 (Aug. 1981).

G. C. Bjorklund et al., "Recording of Gated Holograms Using Two-Photon Photochemistry," 24, IBM Technical Disclosure Bulletin, No. 4 (Oct. 1981).

R. E. Kunz et al., "Optical Information Storage by Spatial Lifetime Hole Burning," 24, IBM Technical Disclosure Bulletin, No. 5 (Oct. 1981).

M. D. Levenson, "Time Domain Optical Information Storage in Systems Capable of Photochemical Hole Burning," 24, IBM Technical Disclosure Bulletin, No. 6 (Nov. 1981).

C. R. Jones, "Fluorescent Imaging System," 24, IBM Technical Disclosure Bulletin, No. 6 (Nov. 1981).

R. A. Bartolini, "Media for High Density Optical Recording," 18, Journal of Vacuum Science Technology, 70–74 (1981).

H. G. Craighead et al., "Microscopically Textured Optical Storage Media," 39, Applied Physics Letters, 532–534 (1981).

J. Drexler, "Drexon Optical Memory Media for Laser Recording," 18, Journal of Vacuum Science Technology, 87–91 (1981).

M. W. Goldberg et al., "Preheat-Aided Optical Disc Recording," 39, Applied Physics Letters, 583–585 (1981).

V. B. Jipson et al., "Infrared Dyes for Optical Storage," 18, Journal of Vacuum Science Technology, 105–109 (1981).

P. Kivits et al., "Laser Induced Melting and Superheating in Te and In Films for Optical Data Storage," 24, Applied Physics, 307–310 (1981).

P. Kivits et al., "Vanadyl Phthalocyanine: An Organic Material for Optical Data Recording," 26, Applied Physics Letters, 101–105 (1981).

T. W. Smith, "The Role of Polymers in Optical Recording Media," 18, Journal of Vacuum Science Technology, 100–104 (1981).

V. E. Wood et al., "Optical Erasure of One- and Two-Photon Holograms in Fe-Doped $LiNbO_3$," 34, Ferroelectrics, 175–178 (1981).

Jon K. Clemens, "Video Disks: Three Choices," IEEE Spectrum, 38–42 (Mar. 1982).

David Y. Lou, "Characterization of Optical Disks," 21, Applied Optics, 1602–1609 (May 1982).

Advertising brochure entitled "Drexon Optical Memory Discs for Laser Recording and Archival Data Storage," Drexler Technology Corporation, 2557 Charleston Road, Mountain View, Calif.

(List continued on next page.)

OTHER PUBLICATIONS

Author unknown, Light, 940–942 (date unknown).

N. F. Borrelli, "Uniaxial Anisotropy in $MgFe_{2-y}Al_yO_4$," J. Appl. Phys., vol. 46, No. 1, p. 430 (1975).

N. F. Borrelli et al., "Interpretation of Induced Colors in Polychromatic Glasses," J. of the Optical Society, vol. 68, #10, p. 1395 (1978).

N. F. Borrelli et al., "New Thin-Film Optical Recording Medium," Proceedings of the Society of Photo-Optical Instrumentation Engineers, vol. 200, Laser Recording and Information Handling (Aug. 27–28, 1979), San Diego, Calif.

N. F. Borrelli et al., "Read-Write-Erasable Thin Film Optical Recording Medium," Proceedings of the Society of Photo-Optical Instrumentation Engineers, vol. 222, Laser Scanning and Recording for Advanced Image and Data Handling (Apr. 8–9, 1980), Washington, D.C.

G. C. Newland et al., "Phototropic Compositions (B)," Ser. No. 768,947, filed Sep. 9, 1968, Defensive Publication, U.S. Patent Office published Feb. 4, 1969.

G. C. Newland et al., "Phototropic Anthraquinone Containing Compositions," Ser. No. 563,097, filed Jul. 6, 1966, Defensive Publication, U.S. Patent Office published Apr. 22, 1969.

J. G. Radziszewski et al., "4-Azahomoadamant-3-ene: Spectroscopic Characterization and Photoresolution of a Highly Reactive Strained Bridgehead Imine," J. Am. Chem. Soc., vol. 107, No. 3, pp. 594–603 (1985).

J. G. Radziszewski et al., "Nondestructive Photoorientation by Generalized Pseudorotation: A Quantitative Treatment," J. Am. Chem. Soc., vol. 109, No. 1, pp. 61–65 (1987).

METHODS AND COMPOSITIONS FOR RECORDING OPTICAL INFORMATION EMPLOYING MOLECULAR PSEUDOROTATION

BACKGROUND

1. Field of the Invention

The present invention relates generally to methods and compositions for recording optical information. More particularly, the present invention relates to recording of optical information by causing and detecting pseudorotation or inversion in specific molecules incorporated within a viscous medium.

2. The Background of the Invention

In view of the constant improvements in the field of computer technology, video recording, and the like, it has become necessary to improve the means by which data can be rapidly and accurately recorded and accessed. Furthermore, the increasing dependence upon computer-generated and recorded information and data has created problems in storing the vast amounts of information and data which are now available.

Currently, storage media typically fall into four general classifications: (1) permanent storage media on which information is recorded and then the medium is rendered incapable of further recording; (2) permanent archival storage media which are similar to permanent storage media except that they have a much longer life; (3) postable storage media on which further information can be recorded after the initial recordation of information; and (4) erasable media. It will be readily appreciated that with the ever-expanding uses for data storage, including the storage of audio visual presentations, the need for new and improved recording methods and media in each of these classifications is increasing.

In the past, magnetic tapes or discs have been the most common storage media for information and data. While magnetic storage media have the advantage of being erasable, they also have the disadvantage of being relatively low in storage density. Thus, a large volume of magnetic tape is required to store a relatively small amount of information.

Accordingly, attention has been directed toward the development of optical recording media, which are capable of recording information at a much higher density. Because most optical recording methods and media are not erasable, however, this type of media has been generally used only for archival storage of records, documents, music, and other types of information.

In general, optical recording methods employ a focused laser which is directed into a medium and which induces a chemical or physical change at the point of contact between the laser beam and the recording medium. This typically forms a permanent "spot" on the medium of about one micron in diameter. In order to "write" information, the information is first converted into a digital format. Utilizing a binary format, for example, the information is converted into one of two possible states, which may be thought of as on-off, black-white, yes-no, or 1 and 0. By coupling electrical impulses having a binary format to a light beam modulator, it is possible to reproduce the information as a set of pulses of the laser which are then directed onto the photosensitive medium, there forming white and dark spots.

In order to "read" the information, the medium is scanned by a focused laser at low power. The pattern of white and dark spots is observed to reconstruct the binary code, which in turn can be readily converted back to its original form. A low power laser may be employed in this process in order to prevent further writing on the medium.

As mentioned above, the primary drawback to virtually all existing systems for optical recording of information is that they are not erasable. These systems essentially record information by "burning" spots at specific locations in the subject medium. In order to attempt to overcome this limitation with existing permanent storage systems, it has been thought that certain reversible physical phenomena could be potentially useful in recording information or in inducing certain optical changes in material in response to a certain set of conditions. Photochromism and phosphorescence provide examples of such reversible phenomena.

The phenomenon of photochromism has long been observed in the chemical arts. Photochromism generally relates to the conversion of a material from a colored chemical to a non-colored chemical, or vice versa. Photochromism may also involve conversion of a material from one colored species to a species which produces a different color or color intensity. Photochromism is generally caused by a light induced chemical reaction which converts the photochromic chemical from a molecule having one type of color characteristics to a molecule which has a different set of color characteristics.

Phosphorescence is a somewhat related phenomenon which results from changing the molecule from a rest or ground state to a phosphorescent excited state, generally by bombarding the molecule with light energy. The molecule will eventually reach a metastable triplet state. In the excited phosphorescent state the molecule has different color characteristics than it does in the ground state. It is expected, however, that the molecule will lose the energy provided by the light bombardment and eventually return to its original low energy ground state. That is, the molecule degrades (or phosphoresces) from the high energy "metastable" state, back to the original energy state.

Many uses of phosphorescent and photochromic molecules have been found in the art. For example, photochromic molecules have been incorporated into eyeglasses which change from one color to another color depending on the brightness of the light to which they are exposed. Thus, the glass may darken as the intensity of sunlight increases. Similarly, it has been suggested that such photochromic molecules could be incorporated into automobile windshields in order to darken the windshield when it is exposed to extremely bright sunlight. This type of molecule has also been incorporated into novelty items such as toys and various of types of jewelry.

Photochromic and phosphorescent molecules have also been used in computer and other similar types of electronic equipment. For example, this type of molecule has been used to provide a visual display of data. It has also been suggested that photochromic or phosphorescent molecules could possibly be used in the recording of information in various sorts of memory devices. One type of memory device would be an optical analog computer in which the particular photochromic or phosphorescent state represents the information stored.

As mentioned above, the color changes known in the art are generally either caused by producing an excited state within the molecule by bombarding the molecule with light energy, or from an actual chemical reaction which is initiated or driven by light. In both cases, the change which occurs to the molecule will generally be reversible, at least over the useful life of the molecule.

In order to make photochromic molecules more acceptable for particular uses, particularly if they are to have potential for use in recording information, it is necessary to add them to desirable environments. For example, photochromic molecules have been modified so that they are water soluble and thus can exist in an aqueous environment. In addition, in order to stabilize photochromic compounds, it is sometimes necessary to incorporate them into a crystal lattice or a clay material. Thus, the photochromic molecule may be stabilized at a desired energy state. Other elaborate techniques have also been developed in order to maintain the photochromic molecule in the desired state.

Many of the systems described above, however, effectively render the molecule useless for incorporation into a system for optically recording of information. For example, it is difficult to incorporate a clay or crystal lattice into an information storage system or optical computer. Thus, while these molecules have shown some promise in information storage, practicalities in their handling have prevented the development of actual usable systems.

It will be appreciated that if such handling problems could be overcome, photochromic molecules could clearly be used for the storage of information. As indicated above, when a molecule changes from one state to another state, which states can be easily detected through changes in optical characteristics, it may be possible to record information using this mechanism.

One additional reason that existing systems are not acceptable for data storage, however, is that it is often difficult to maintain the photochromic or phosphorescent molecule in the desired state. This is particularly true when dealing with excited phosphorescent molecules. As mentioned above, photochromic molecules often require stabilization, such as incorporation into some type of mineral lattice, in order to maintain a particular colored state.

Another problem is that photochromic molecules must be chemically converted, through an optically driven chemical reaction, in order to move from one colored state to another. After repeated conversions fatigue often sets in. That is, a molecule can be changed from one molecule to a different molecule only a limited number of times. This fatigue phenomenon is usually due to undesired side reactions which occur within the system. Eventually, the system fails to convert the chemicals as desired and the system must be replaced.

A further problem in the existing art is that large quantities of light are required in order to make the required conversion, thus limiting the use of such systems for recording information. It is not generally practical to provide the large quantities of energy necessary to convert existing photochromic species repeatedly from one state to another within an information storage system. In particular, it would be impossible to use existing systems in a computing device because of the large quantities of light which would be required.

Another limitation in the art is that it is necessary to make fine measurements of color intensity within the photochromic molecule in order to determine what state exists. Because there may exist a color gradient within the subject medium it is sometimes difficult to determine whether the majority of the photochromic molecules are in one state or another. This limitation makes it difficult to accurately record optical information.

It is apparent that what is currently needed in the art is a system for accurately recording optical information which overcomes the problems discussed above. In particular, it would be a significant advancement in the art to provide compositions and methods for recording optical information which could be incorporated into easily handled systems and which do not require a net chemical transformation of the light absorbing chromophore within the optical recording medium in order to operate. It would be a related advancement in the art to provide such methods and compositions which could be incorporated into an easily handled polymeric medium. It would be a further advancement in the art to provide such compositions and methods which required very low light intensity to record and read optical information. It would be another advancement in the art to provide such methods and compositions which could repeatedly save and erase optical information without producing fatigue within the system. It would also be an advancement in the art to provide such a system having a high signal to noise ratio.

Such methods and compositions are disclosed and claimed herein.

BRIEF SUMMARY AND OBJECTS OF THE INVENTION

The present invention is related to methods and compositions for optically recording information. Using the methods and compositions of the present invention, optical recording can take place using low energies to write and read information and without causing fatigue within the system. This is achieved in the present invention because actual net chemical transformations are not induced in order to write on the system.

The objects of the present invention are achieved by incorporating a specifically chosen solute molecule within an extremely viscous medium. The system may, for example, include solute molecules incorporated within an extremely low temperature medium, or may include such solute molecules tightly bound as chromophores within a polymeric medium. The chromophore is the portion of the polymer molecule which is responsible for the information storage function. Chromophores and solute molecules are sometimes collectively referred to as solute molecules in the following discussion and claims.

Solute molecules, or chromophores to be attached to a polymeric medium, are specifically chosen so that they are capable of undergoing "pseudorotation" or "inversion." Pseudorotation simply comprises an internal rearrangement of the bonds within a molecule or chromophore which results in no net chemical change and yields the same chemical species oriented differently. In the inversion process a molecule rearranges its bonds in such a way that it is converted into a non-superimposable mirror image.

Pseudorotation does not comprise any net chemical transformation of the molecule or chromophore into another chemical species or its actual rotation in space. Photoinduced pseudorotation does not change the intrinsic spectroscopic properties of the molecule and, thus, differs fundamentally from photochromism. Pseudorotation may occur, for example, when a proton, or group of protons, are realigned within a complex molecule to yield the same chemical structure differently oriented. The molecule, however, experiences no other chemical conversion.

One example of a molecule in which pseudorotation is observed is octaethylporphin (hereinafter sometimes referred to as "OEP"). In the case of octaethylporphin, for example, it is known that protons within the center of the porphin ring may shift alignment. That is, they may lose their attachment to one pair of internal nitrogen atoms and reattach to a different pair of internal nitrogen atoms. After this change, a molecule of octaethylporphin is still present, but appears to have rotated 90 degrees even though no actual rotation has occurred. The two mirror-image forms of octaethylporphin are illustrated below:

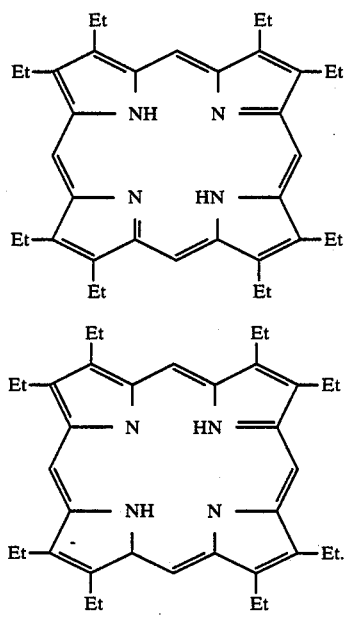

Pseudorotation within octaethylporphin, comprising a shifting of internal protons may be achieved by directing polarized light into a medium containing the tightly bound octaethylporphin molecule. If light is polarized in a particular direction it will cause a particular alignment of the protons within the solute molecule to be more probable than the alternative alignment. This alignment may be changed by directing light polarized in a different direction into the medium. This causes pseudorotation, or a different proton alignment, within the solute molecule.

The various different alignments of the solute molecules or chromophores can then be easily detected. For example, the alignment may be detected by simply measuring the birefringence of the material by directing suitably polarized light through the medium and observing changes in its state of polarization as it passes through the subject area.

It will be appreciated that such a system operating on the mechanism of pseudorotation is particularly adaptable for recording optical information. The information may be written onto the medium by simply directing light polarized in a particular direction into a particular spot within the medium. This will cause pseudorotation of the solute molecules into a specific orientation. This pseudorotation can then be read by directing specifically polarized light into the same general area and detecting the effect of the birefringence on the light as it exits. The reading light can be of the same wavelength as the writing light, but much weaker in intensity. Alternatively, the reading light can be of a different wavelength, preferably one that is not absorbed by the imbedded solute molecules so that the stored information can be read repeatedly without any erasure.

It is, therefore, a general object of the present invention to provide improved methods and compositions for recording optical information.

It is a further object of the present invention to provide methods and compositions for recording optical information which do not require transformation of solute molecules or chromophores within the system into a different chemical species.

It is also an object of the present invention to provide methods and compositions for optical recording which employ an easily handled medium, such as a polymer medium.

It is another object of the present invention to provide methods and compositions for optical recording which require only low energy to write information and to later read that information and which results in a high signal to noise ratio.

It is an additional object of the present invention to provide methods and compositions for recording optical information, in an easily handled system such as a polymer, wherein there is no need to convert the subject molecule into another chemical species or to rely on information in a metastable electronically excited state.

These and other objects and advantages of the present invention will become apparent upon reading the following detailed description and appended claims, and upon reference to the accompanying drawings.

DETAILED DESCRIPTION OF THE PREFERRED EMBODIMENTS

Figure 1:
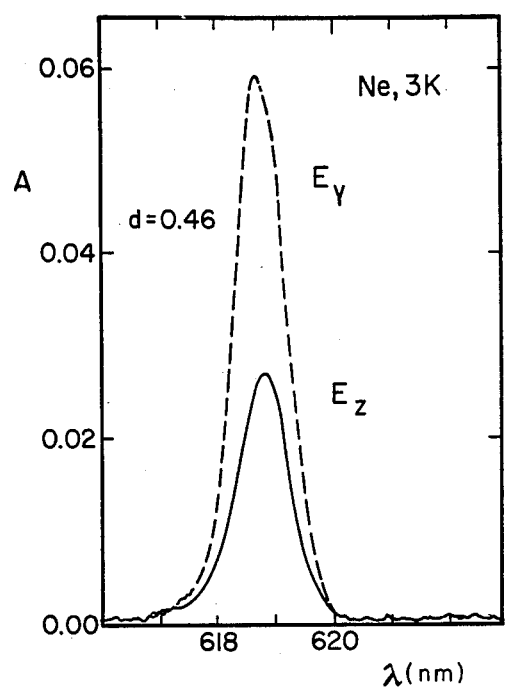
FIG. 1 is a graph showing the linear dichroism of octaethylporphin imbedded in a rigid neon matrix at 3K after irradiation with Z-polarized light.

As mentioned above, the present invention is related to methods and compositions for optically recording information. In particular, the present invention relates to obtaining solute molecules which are capable of "pseudorotation" or "inversion." These molecules are then photooriented by a light induced molecular structure rearrangement. This molecular structure rearrangement may be thought of as orientation by photoinduced pseudorotation, or by producing the enantiomer of the molecule by photoinduced inversion. Both of these mechanisms are jointly referred to as photoorientation by generalized pseudorotation.

It has been found that pseudorotation may be induced in particular molecules embedded in a highly viscous medium or chromophores attached to a polymer chain by passing polarized light of a wavelength which is absorbed through the molecules while the molecules are tightly bound within a medium. The passage of light polarized in a particular direction will cause preferred pseudorotation with respect to this direction. This particular oriented state is stable in the dark but reorientation along a new direction can be accomplished by a differently polarized light pulse, the oriented state can then be detected at the subject location and, therefore, used as a method of recording information.

In order for the present invention to accomplish its purposes, it is necessary for the solute molecules to be effectively bound within the medium so that random thermal rotation is prevented. That is, the solute molecules must be immobilized so that actual rotation of the solute molecules does not occur. This can be accomplished by either lowering the temperature of the medium or by incorporating the solute or chromophore into a viscous medium. Preventing actual rotation assures that only the internal pseudorotation is detected as opposed to generalized random rotation of the solute molecules within the medium.

There are multiple mechanisms whereby the solute molecule may be bound in a medium. For example, it has been found that solute molecules may be bound in an extremely low temperature medium. Such a medium, because of its low temperature, is extremely viscous and does not allow the solute molecules to rotate. In addition, there is only a very small amount of energy available in the medium to produce any such rotation of the solute molecules and thus to effect a thermal reversal of the light-induced pseudorotation.

An alternative and potentially more practical method for preventing actual rotation of the solute molecules is to bind the molecules in a polymer matrix. The solute molecules may be simply incorporated throughout the polymer medium or, in the alternative, the solute molecules may be actually chemically bound to the polymer or chains. As a result, the solute molecule becomes the chromophoric portion of the polymer chain. In any event, it is only required that the solute molecules or chromophores be sufficiently securely bound in the polymer medium that actual rotation of the molecules is effectively prevented. Thus, the only rotation which is available for each molecule or chromophore is internal pseudorotation. The solute incorporated or bound within the medium, therefore, provides a method of recording and later reading information based on the orientation of the solute molecules or the chromophoric portion of the polymeric chain. This is true because the orientation of the solute molecules can be accurately controlled and also read as desired.

One example of a solute molecule which has been found capable of experiencing pseudorotation in an experimental setting is octaethylporphin. It will be appreciated with reference to the above illustrations of the alternate structures of octaethylporphin, that pseudorotation may be achieved using this molecule. Specifically, the hydrogen atoms bound to the two nitrogen atoms in the center of the porphin ring may alternate positions in response to an external stimulus. This may be accomplished without rotation of the molecule as a whole. As a result, two different forms of the molecule are available for recording information without requiring a chemical reaction to change the molecule into another chemical species. Simply realigning the hydrogen atoms within the interior of the structure is sufficient to produce the two differently aligned forms of octaethylporphin.

In order for the present invention to operate, it is necessary to orient solute molecules contained within the medium in a particular manner. The specific orientation of the molecules may be thought of as either a "0" or a "1" state. For example, in a vertically oriented sample, one alignment axis could be vertical (Z) and one horizontal (Y). As a result, orientation of the molecule in a particular location can be used to store information.

It is found that one method of orienting the molecules in the desired manner is to pass polarized light of a wavelength absorbed by the molecule through the medium. Depending on the direction in which the light is polarized (e.g., Y or Z), each solute molecule will take one of the two structures shown above, with unequal probability. Alternatively, in the event that the light is circularly polarized (or unpolarized) the orientation of the solute molecules may remain random with respect to Y and Z. In essence, Z polarized light will produce solute molecules the majority of which are oriented such that the absorbing electric dipole transition moment direction is inclined away from Z, and approximately parallel to Y. Y-polarized light will produce solute molecules that are pseudorotated into the mirror image configuration such that the absorbing transition moment direction is inclined away from Y and toward Z. Finally, circularly polarized or unpolarized light will produce no preferential alignment of the absorbing transition moments with respect to the Y and Z directions.

As a result, the system has memory for the polarization direction of the light that impinged on it last, and, therefore, information may be stored within the solute molecules. One particular state is produced by the passage of Z-polarized light through the medium and may, for example, be designated the "1" state. Another state will be obtained by Y-polarized light passed through the medium and may, for example, be designated the "0" state. If desired, additional states can be produced by the use of light of other polarizations as noted above.

In order to read the information contained within the medium it is simply necessary to pass an additional beam of light through the subject area within the medium. One method of determining the information written in a particular area is to measure the dichroic ratio obtained when light is passed through the subject area of the medium. That is, the ratio of the absorbance of Z-polarized light to that of Y-polarized light is determined. Using this ratio it is possible to determine what type of orientation the solute molecules have within the medium. This method is described in additional detail below.

Another method of reading the information, which may also be much more sensitive than that employing the dichroic ratio, is simply to measure the effect of birefringenece of the sample on the polarization of light passed through the medium. Birefringence measurement is more effective since it can be performed at wavelengths that are not absorbed by the sample and therefore need not affect the information stored even after very many readings. Birefringence is a term applied to certain anisotropic materials; that is, materials in which the observable properties of light change depending upon its polarization and upon the direction that the light travels through the materials. This is in contrast to isotropic optically inactive materials in which the observable properties of light remain constant regardless of the direction of light travel through the medium and of its polarization.

Birefringence is caused on a molecular level by a regular ordering (whether partial or complete) of molecules. If this regular ordering is disturbed or modified in a localized area, thereby modifying the birefringence, polarized light passing through areas having birefringence will be affected differently than polarized light passing through an unmodified area. Hence, the basic requirement for recording binary-encoded information (i.e., the presence or absence of changes in a physical property at specific locations of a recording media) is present since there exist detectable and reproducible states within the medium. It will be appreciated from the discussion above that an information system using three or more separate and measurable states may also be produced using the mechanism described.

It will further be appreciated that the light used to read the information may be potentially destructive of the recorded information or, in the alternative, it may be nondestructive. This can be controlled by using an appropriate wavelength and intensity of light. Thus the information recorded may remain recorded for future reference or may be essentially erased as it is read.

As mentioned above various solute molecules may be chosen. It is simply necessary that the molecule be capable of pseudoorientation or enantiomeric inversion when incorporated within the extremely viscous medium. As mentioned above, one molecule which is capable of pseudorotation is octaethylporphin. A molecule capable of enantiomeric inversion when incorporated into a viscous medium is 4-azahomoadamant-3-ene.

Various media may also be available for binding the solute molecules. In the experimental setting these have included low temperature frozen inert gases such as argon, neon, and nitrogen. More practically, however, the medium is preferably a polymer which can be easily handled and incorporated into an information storage system. Such polymers may, for example, include polyvinyl chloride (PVC), polyethylene, poly(ethylene terephthalate) (PET), poly(methyl methacrylate) (PMMA). Various other types of media can also be used such as glassy 3-methylpentane and 2-methyltetrahydrofuran at low temperatures.

A. Experimental Verification

Experiments have been run using octaethylporphin to confirm the system described above. These experiments have produced data which clearly indicate the usefulness of pseudorotation in recording optical information.

The 0-0 peak (origin) of the Q band of OEP is located near 619 nm and is relatively isolated from other absorption peaks as can be appreciated from FIGS. 1 and 2, as well as Table 1 below. The 0-0 peak is particularly narrow in a frozen gas matrix.

It has been found that two separate peaks corresponding to distinct classes of sites can be clearly discerned. In a neon matrix, the two classes of sites absorb at 613.1 nm and at 618.6 nm. The environments in these two classes of sites almost certainly differ primarily by a 90° rotation, or by relocation of the internal hydrogens in the solute, without relaxation in the surroundings. The inhomogenous broadening of the two peaks is then due to further fine differences in the solute environment. The photoorienting light used was of bandwidth sufficient to ensure excitation of both classes of sites, and the dichroic ratios were measured by integration.

In all of the experimental matrices outlined below, except PET, where no effect was observed, irradiation into the Q band origin with Z-polarized light induced the expected negative dichroism (dichroic ratios $d_j = E_Z/E_Y$ 1) at the origin (both sites), and positive dichroism in the 515-525 nm region, where several peaks, most of them polarized perpendicular to the Q band origin, overlap. The limiting dichroic ratios observed at the origin after some minutes to hours of Z-polarized irradiation are listed in Table 1 below along with the corresponding orientation factors ($K_j$) for a series of OEP-containing samples ($K_j$ is the average value of the square of the cosine of the angle between the transition moment of the Q band origin and the Z axis). It appears that the limiting theoretical values ($d_j = 0.40$, $K_j = 0.17$) are almost reached within the experimental uncertainty of about ±10 percent in $d_j$ in the least interacting matrix (Ne) at the lowest temperature (3 K.). These are, of course, far larger effects than those needed in a practical application.

In other environments, the theoretical degree of alignment is not quite reached, and in some instances a smaller degree of alignment is achieved. This is believed to be due primarily to site memory effects, and possibly to the ability of the OEP molecules to rotate slowly in some matrices, even at the low temperatures used. Still, however, sufficient alignment is achieved to produce an easily detectable read-out.

TABLE 1

Visible dichroism of OEP in various matrices in the photostationary state attained by irradiation with Z-polarized 620 nm light.

| Matrix | (nm) | T(K) | $d_j$ | $K_j$ | F(%)[1] |
|---|---|---|---|---|---|
| Theory | | | 0.40 | 0.17 | 0 |
| Ne | 618.6 | 4.5 | 0.46 | 0.19 | 14 |
| Ar | 618.8 | 12 | 0.50 | 0.20 | 20 |
| N$_2$ | 616.8 | 12 | 0.50 | 0.20 | 20 |
| PMMA | 615.9 | 12 | 0.52 | 0.21 | 26 |
| PVC | 614.3 | 77 | 0.55 | 0.22 | 32 |
| 3-MP | 622.8 | 77 | 0.73 | 0.27 | 62 |
| 2-MTHF | 621.8 | 77 | 0.82 | 0.29 | 74 |
| PET | 616.5 | 12 | 1.00 | 0.33 | 100 |

[1]Percentage of solute molecules that can be thought of as unorientable since they occupy sites with perfect memory.

The site memory effect can be viewed in two ways. It is possible that a certain fraction of the solute molecules (F) resides in sites with perfect memory, half containing the A' form and half the A" form, both incapable of phototransformation into the other, while the remaining fraction of the solute molecules (1-F) exhibit the ideal interconverting behavior assumed above. Alternatively, the environments of all solute molecules could favor the solute form which they originally contained (half of them A' and half A") by a certain margin, so that the quantum yields (A'—A") for any one site would differ. In reality, some situation intermediate between the two extremes most probably prevails.

Regardless of which statistical interpretation is correct, the F value for a particular matrix material characterizes quantitatively its effective site memory capability and thus its suitability for the kind of system of interest here.

The dichroic spectra of OEP photooriented with Z-polarized light in a neon matrix at 3 K. were investigated in more detail, using narrow-bandwidth laser excitation for selective irradiation of a single site class. The initial spectra obtained after photoorientation with broad-band light are shown in FIG. 1. The peaks due to the two classes of sites are distinctly separate and they differ slightly but reproducibly in their degree of alignment, suggesting slightly different memory effects in the two environments (only the long-wavelegnth peak is shown in FIG. 1). Subsequent selective irradiation of the long-wavelength site class with Y-polarized dye laser light rapidly inverted the sign of its dichroism as shown in FIG. 2 while that of the shorter-wavelength site class decreased noticeably but remained negative.

These results show conclusively that the two peaks indeed belong to distinct forms of OEP molecules as expected from previous results in other matrices. Each form is oriented totally differently after the second irradiation. The decrease in the degree of alignment of the shorter-wavelength site class during the irradiation of the longer-wavelength site class is compatible with the notion that the shift of the internal hydrogens upon excitation is accompanied by a relaxation of the environment most of the time (photoorientation without a change of site class occupancy) but proceeds without such relaxation some of the time (photoorientation with site class interconversion).

Similar results were obtained at 4.5 K. in argon matrix, in which OEP also occupies two distinct classes of sites. The observed $d_j$ values are somewhat higher, perhaps partly because of the somewhat lower optical quality of argon relative to neon in general, and partly because of somewhat larger memory effects.

These experiments show, however, that using a simple model of photoorientation by generalized pseudorotation the quantitative relations can be determined between the orientation of transition moment directions in a solute molecule and its limiting degree of alignment. Using octaethylporphin in various rigid media, the theoretical memory-free limiting values were reached within experimental error for samples contained in a neon matrix at 3 K.

Since amorphous rigid samples exhibiting molecular photoorientation by generalized pseudorotation clearly have the capacity to preserve local memory of the state of polarization of light that impinged on them last, they are useful for erasable optical information storage devices.

Figure 2:
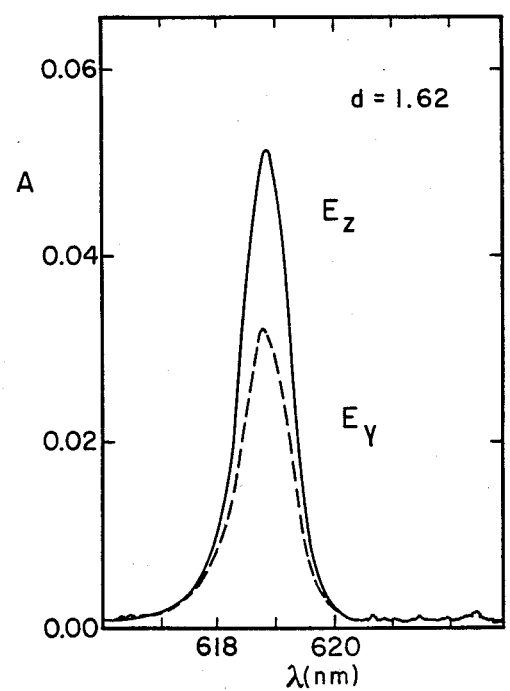
FIG. 2 is a graph showing the linear dichroism of the same sample octaethylporphin after subsequent irradiation with Y-polarized light.

These experimental data, as illustrated in Table 1 and FIGS. 1 and 2 clearly indicate the usefulness of the present invention in recording optical information. In particular, optical information can be recorded erasably and without the need for any chemical conversion of the solute molecule into another chemical species or into an unstable state.

Further, as illustrated above, the present invention provides for incorporating desirable solute molecules into an easily handled polymeric medium. This provides the potential of avoiding handling difficult media, such as crystal lattices, in order to provide the benefits derived from the present invention.

It is found further that relatively low energies can be used to "read" and "write" on the present system. Because of the high sensitivity of existing birefringence-based read out, this system offers the advantage that only small amounts of light energy are required for recording and reading information. This provides clear potential to incorporate the present invention in a more complex information recording system, and even potentially, an optical computing device. As mentioned above, these objects are all achieved without the need to convert molecules from one chemical species to another. Thus, the fatigue experienced in the prior art can be avoided.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. A chemical composition which is capable of recording optical information, comprising:
    an effective quantity of solute molecules incorporated within a medium, wherein the solute molecules are capable of being selectively oriented, in response to the direction of polarization of polarized light passed through the medium, into at least two configurations through the mechanism of generalized pseudorotation and wherein said medium is sufficiently viscous with respect to the solute molecules to substantially prevent actual rotation of the solute molecules within the medium.

2. A chemical composition which is capable of recording optical information as defined in claim 1 wherein solute molecules are incorporated within the medium by chemical bonding.

3. A chemical composition which is capable of optically recording information as defined in claim 1 wherein the orientation of the solute molecules is maintained for a sufficient period of time to allow the orientation to be detected.

4. A chemical composition which is capable of optically recording information as defined in claim 3 wherein the orientation of the solute molecules is detectable by measuring the birefringence of the medium by passing light through the medium.

5. A chemical composition which is capable of optically recording information as defined in claim 3 wherein the orientation of the solute molecules is detectable by measuring the linear dichroism of the medium.

6. A chemical composition which is capable of optically recording information as defined in claim 3 wherein the detection of the orientation of the solute molecules does not affect the orientation of the solute molecules.

7. A chemical composition which is capable of optically recording information as defined in claim 1 wherein the solute may be selectively reoriented by radiation passed through the medium.

8. A chemical composition which is capable of optically recording information as defined in claim 1 wherein the medium is a polymer.

9. A chemical composition which is capable of optically recording information as defined in claim 8 wherein the polymer is selected from the group consisting of: polyvinyl chloride, polyethylene, poly(ethylene terephthalate), and poly(methylmethacrylate).

10. A chemical composition which is capable of optically recording information as defined in claim 1 wherein the solute comprises octaethylporphyrin.

11. A chemical composition which is capable of optically recording information as defined in claim 1 wherein the solute comprises 4-azahomoadamant-3-ene.

12. A chemical system adaptable for use in recording optical information, comprising:
    an effective quantity of solute molecules incorporated within a medium, wherein the solute molecules are capable of being selectively oriented through the mechanism of generalized pseudorotation, into at least two detectable configurations, by polarized light passed through the medium, and wherein said medium comprises a polymer which is sufficiently viscous with respect to the solute molecules to substantially prevent actual rotation of the solute molecules within the medium.

13. A chemical system adaptable for use in recording optical information as defined in claim 12 wherein solute molecules are incorporated within the medium by chemical bonding.

14. A chemical system adaptable for use in recording optical information as defined in claim 12 wherein the orientation of the solute molecules is detectable by measuring the birefringence of the medium.

15. A chemical system adaptable for use in recording optical information as defined in claim 12 wherein the orientation of the solute molecules is detectable by measuring the linear dichroism of the medium.

16. A chemical system adaptable for use in recording optical information as defined in claim 12 wherein the detection of the orientation of the solute molecules does not affect the orientation of the solute molecules.

17. A chemical system adaptable for use in recording optical information as defined in claim 12 wherein the solute may be selectively reoriented by radiation passed through the medium.

18. A chemical system adaptable for use in recording optical information as defined in claim 12 wherein the polymer is selected from the group consisting of: polyvinyl chloride, polyethylene, poly(ethylene terephthalate), and poly(methyl methacrylate).

19. A chemical system adaptable for use in recording optical information as defined in claim 12 wherein the solute comprises octaethylporphyrin.

20. A chemical system adaptable for use in recording optical information as defined in claim 12 wherein the solute comprises 4-azahomoadamant-3-ene.

21. A method for recording optical information comprising the steps of:
(a) providing a solute-medium system comprising an effective quantity of solute molecules incorporated within a medium, wherein the solute molecules are capable of being selectively oriented by polarized light passed through the medium into a least two detectable configurations through the mechanism of generalized pseudorotation, and wherein said medium comprises a polymer which is sufficiently viscous with respect to the solute molecules to substantially prevent actual rotation of the solute molecules within the medium;
(b) directing a first quantity of polarized light into a selected location within the medium such that the solute molecules are oriented in a particular manner;
(c) directing a second quantity of light into the selected location within the medium;
(d) detecting the characteristics of the second quantity of light after it exists the medium in order to determine the orientation of the solute molecules within the selected location within the medium.

22. A method for recording optical information as defined in claim 21 wherein the second quantity of light comprises polarized light.

23. A method for recording optical information as defined in claim 21 wherein the birefringence of the medium is determined by detecting the characteristics of the second quantity of light after it exits the medium.

24. A method for recording optical information as defined in claim 21 wherein the linear dichroism of the medium is determined by detecting the characteristics of the second quantity of light after it exits the medium.

* * * * *